United States Patent
Sato et al.

(10) Patent No.: US 10,100,413 B2
(45) Date of Patent: Oct. 16, 2018

(54) COMPONENT FOR PLASMA APPARATUS AND METHOD OF MANUFACTURING THE SAME

(71) Applicants: KABUSHIKI KAISHA TOSHIBA, Minato-Ku, Tokyo (JP); TOSHIBA MATERIALS CO., LTD., Yokohama-Shi, Kanagawa-Ken (JP)

(72) Inventors: Michio Sato, Kanagawa (JP); Takashi Hino, Kanagawa (JP); Masashi Nakatani, Mie (JP)

(73) Assignees: Kabushiki Kaisha Toshiba, Tokyo (JP); Toshiba Materials Co., Ltd., Kanagawa-Ken (JP)

( * ) Notice: Subject to any disclaimer, the term of this patent is extended or adjusted under 35 U.S.C. 154(b) by 182 days.

(21) Appl. No.: 15/039,886

(22) PCT Filed: Nov. 26, 2014

(86) PCT No.: PCT/JP2014/081190
§ 371 (c)(1),
(2) Date: May 27, 2016

(87) PCT Pub. No.: WO2015/080135
PCT Pub. Date: Jun. 4, 2015

(65) Prior Publication Data
US 2017/0002470 A1    Jan. 5, 2017

(30) Foreign Application Priority Data
Nov. 29, 2013   (JP) .................................. 2013-248236

(51) Int. Cl.
*C23C 24/08*   (2006.01)
*C23C 24/04*   (2006.01)
(Continued)

(52) U.S. Cl.
CPC ................ *C23C 24/08* (2013.01); *B05D 1/10* (2013.01); *C04B 35/581* (2013.01);
(Continued)

(58) Field of Classification Search
USPC ..... 427/180, 189, 190, 376.1; 428/325, 336, 428/698
See application file for complete search history.

(56) References Cited

U.S. PATENT DOCUMENTS 7,319,080 B2 * 1/2008 Kanechika ............ C04B 35/581
501/98.5
2002/0047110 A1 * 4/2002 Takao .................... B82Y 30/00
252/500
(Continued)

FOREIGN PATENT DOCUMENTS

JP    H07297265 A   11/1995
JP    2000158275 A   6/2000
(Continued)

OTHER PUBLICATIONS

International Search Report (in Japanese with English Translation) for PCT/JP2014/081190, dated Feb. 17, 2015; ISA/JP.
(Continued)

*Primary Examiner* — Archene A Turner
(74) *Attorney, Agent, or Firm* — Harness, Dickey & Pierce, PLC

(57) ABSTRACT

A base material is composed of a metal or ceramics, and an aluminum nitride coating is formed on an outermost surface thereof. The aluminum nitride coating is formed by impact sintering and contains fine particles having a particle diameter of 1 μm or less. A thickness of the aluminum nitride coating is no less than 10 μm. A film density of the aluminum nitride coating is no less than 90% An area ratio of aluminum nitride particles whose particle boundaries are recog-
(Continued)

nizable existing in a 20 μm×20 μm unit area of the aluminum nitride coating is 0% to 90% while an area ratio of aluminum nitride particles whose particle boundaries are unrecognizable is 10% to 100%. Such a component for a plasma apparatus having the aluminum nitride coating can provide a strong resistance to plasma attack and radical attack.

15 Claims, 1 Drawing Sheet

(51) Int. Cl.
| | |
|---|---|
| C23C 4/129 | (2016.01) |
| B05D 1/10 | (2006.01) |
| C23F 15/00 | (2006.01) |
| C04B 35/581 | (2006.01) |
| C04B 35/622 | (2006.01) |
| C04B 35/63 | (2006.01) |
| H01J 37/32 | (2006.01) |

(52) U.S. Cl.
CPC .... *C04B 35/62222* (2013.01); *C04B 35/6303* (2013.01); *C23C 4/129* (2016.01); *C23C 24/04* (2013.01); *C23F 15/00* (2013.01); *H01J 37/32477* (2013.01); *B05D 2202/00* (2013.01); *B05D 2203/30* (2013.01); *C04B 2235/5436* (2013.01); *H01J 2237/334* (2013.01)

(56) References Cited

U.S. PATENT DOCUMENTS

| | | | |
|---|---|---|---|
| 2004/0126502 A1* | 7/2004 | Ferrato | C04B 35/581 427/376.1 |
| 2004/0126598 A1* | 7/2004 | Tanaka | C04B 35/581 428/469 |
| 2007/0065678 A1 | 3/2007 | Ko et al. | |
| 2012/0216955 A1 | 8/2012 | Eto et al. | |

FOREIGN PATENT DOCUMENTS

| | | |
|---|---|---|
| JP | 2003133196 A | 5/2003 |
| JP | 2007508690 A | 4/2007 |
| JP | 2009293061 A | 12/2009 |
| JP | 2012191200 A | 10/2012 |
| WO | WO-2013176168 A1 | 11/2013 |

OTHER PUBLICATIONS

International preliminary report on patentability dated Jun. 9, 2016 in related foreign application PCT/JP2014/081190, with English translation.

\* cited by examiner

COMPONENT FOR PLASMA APPARATUS AND METHOD OF MANUFACTURING THE SAME

CROSS REFERENCE TO RELATED APPLICATIONS

This application is a U.S. National Phase Application under 35 U.S.C. 371 of International Application No. PCT/JP2014/081190 filed on Nov. 26, 2014 and published as WO 2015/080135 A1 on Jun. 4, 2015. This application is based on and claims the benefit of priority from Japanese Application No. 2013-248236 filed on Nov. 29, 2013. The entire disclosures of all of the above applications are incorporated herein by reference.

TECHNICAL FIELD

The present invention relates to a component for a plasma apparatus and a method of manufacturing the component, the component being coated with an aluminum nitride film (coating film) exhibiting good corrosion resistance to halogen-type corrosive gasses and plasma, and being suitable for use in a plasma processing apparatus used for, e.g., semiconductor or liquid-crystal manufacturing process.

BACKGROUND ART

Among components used in semiconductor manufacturing apparatuses, the components for apparatuses used in an etching process, a CVD film-forming process, and an ashing process for removing a resist, which are based mainly on plasma processing, are exposed to halogen-type corrosive gasses such as fluorine or chlorine that are highly reactive.

Therefore, in the components that are exposed to halogen plasma in processes such as mentioned above, ceramics such as aluminum oxide, aluminum nitride, yttrium oxide and YAG are used as constituent materials. In particular, among the ceramics, the aluminum nitride having a high thermal conductivity and good corrosion resistance is favorably used in consideration of performance/cost balance.

Examples of such conventional ceramic components for plasma apparatuses may include electrostatic chucks disclosed in Patent Document 1 in which a metal electrode is embedded inside the aluminum nitride, a volume resistivity of a dielectric layer provided between a wafer and the inside electrode is adjusted to be $10^8$ to $10^{12}$ $\Omega$·cm, whereby what is called a Johnsen-Rahbek force, which provides an enhanced wafer adsorption force at a low temperature, is generated so as to adsorb the wafer.

However, since aluminum nitride is a sintering-retardant material, sintering is performed with a sintering aid added to aluminum nitride raw material powder. The mechanism of the sintering is that: addition of the sintering aid generates low-melting-point reaction products at particle boundaries, which brings the particle boundaries into a liquid phase and mass transfer of aluminum nitride is performed via the liquid phase. Accordingly, many particle boundary layers exist among the particles of the sintered body, and when stresses are concentrated at particle boundaries, breakage of the sintered body starts and advances from the particle boundaries, resulting in dropout of particles.

Thus, in the case of a component for a plasma apparatus (electrostatic chuck), since adsorption of a wafer to the component and desorption of the wafer from the component are repeated, a stress is caused on an adsorption surface of the component composed of aluminum nitride for plasma apparatuses. Therefore, there may be posed a problem such that particles are generated due to particle dropout and the wafers are contaminated by the particles.

Therefore, Patent Document 1 proposes a component for a plasma apparatus (electrostatic chuck) using an aluminum nitride in which amount of sintering aid is controlled and breakage of particle boundaries is suppressed, the particle boundaries being likely to be sources of generation of particles.

Patent Document 1 also proposes a component for a plasma apparatus (electrostatic chuck) using an aluminum nitride in which the generation of particles is suppressed by addition of, e.g., titanium nitride.

PRIOR ART DOCUMENTS

Patent Document

Patent Document 1: Japanese Patent Laid-Open No. 2003-133196

In the components for plasma apparatuses (electrostatic chucks) using aluminum nitride as a material such as those in Patent Document 1, the generation of particles caused by breakage of the particle boundary has been a serious problem. Therefore, a type of sintering aid and/or addition amount of the sintering aid has been suitably adjusted. However, decrease in addition amount of the sintering aid results in imperfect sintering, which makes it difficult to control the volume resistivity, which is an important factor for a function of the electrostatic chuck.

Although the generation of particles is suppressed by addition of titanium nitride, the demand for particle reduction has been increasingly severe in recent years. Thus, only addition of titanium nitride is insufficient and further reduction in amount of generating particles has been more difficult.

Furthermore, because of the existence of the particle boundary phases, even if the sintered body is subjected to, e.g., polish finishing, irregularities remain in a surface of the sintered body. Further, the particles existing in a surface of the dielectric layer drop out at the time of processing such as etching, which causes the problem of generation of particles.

Furthermore, in a case where aluminum oxide and titanium nitride are added to aluminum nitride, the components for plasma apparatuses (electrostatic chucks) to be exposed to corrosive gasses such as halogen gasses or plasma are required to have a high corrosion resistance. Further, the addition of aluminum oxide and titanium nitride to aluminum nitride causes the corrosion resistance to be decreased by particle boundary phases formed by the addition of sintering aids, and thus results in the problem of inducing the generation of particles.

In recent semiconductor elements, in order to achieve high integration, wiring pitches are getting narrower (to, for example, 24 nm to 19 nm). In such narrowed wirings and elements including the narrowed wirings, for example, even commingling (mixing) of ultrafine particles (fine particles) with a diameter of around 40 nm causes a failure such as wiring failure (conduction failure) and element failure (short circuit), so that it has strongly been desired to even more strictly suppress the generation of fine particles from components included in the apparatuses.

SUMMARY OF THE INVENTION

Problems to be Solved by the Invention

The present invention has been made to solve such problems, and an object of the present invention is to provide a component for a plasma apparatus capable of exhibiting enhanced plasma resistance and corrosion resistance of a coating itself and thereby enabling stable and effective suppression of generation of particles such as particle dropout in an etching process. The component enables the plasma apparatus to suppress the productivity decrease caused by e.g., apparatus cleaning and/or component replacement and to increase in etching and firm-forming cost. The component also enables to prevent the film detachment (film peeling), suppression of generation of fine particles and prevention of impurity contamination. Another object of the present invention is to provide a component for a plasma apparatus and a method of manufacturing the component capable of preventing damage such as corrosion and/or deformation of members caused by chemical treatment and/or blasting in reuse processing.

Means for Solving the Problems

In a component for a plasma apparatus according to the present invention, the component is characterized by comprising an aluminum nitride coating (film) formed by impact sintering method, the aluminum nitride (AlN) coating contains aluminum nitride particles, a thickness of the coating is no less than 10 μm, a density of the coating is no less than 90%, an area ratio of aluminum nitride particles whose particle boundaries are recognizable existing in a unit area of 20 μm×20 μm in a coating structure is 0% to 90% while an area ratio of aluminum nitride particles whose particle boundaries are unrecognizable is 10% to 100%.

It is preferable that: a film thickness of the aluminum nitride coating be 10 to 200 μm; and a density of the aluminum nitride coating be no less than 99% and no more than 100%. It is preferable that: the aluminum nitride particles include fine particles having a particle diameter (size) of no more than 1 μm; and an average particle diameter of the aluminum nitride particles whose particle boundaries are recognizable be no more than 2 μm.

It is also preferable that an average particle diameter of all the aluminum nitride particles be no more than 5 μm. In the aluminum nitride coating, it is preferable that where the coating is subjected to XRD analysis, a ratio of a most intensive peak Im of AlN to a most intensive peak Ic of $Al_2O_3$ (Im/Ic) be no less than 8. It is preferable that a surface roughness Ra of the aluminum nitride coating be made to no more than 0.5 μm by polishing treatment.

A method of manufacturing a component for a plasma apparatus according to the present invention in which the component includes an aluminum nitride coating formed by impact sintering, the method comprises the steps of: supplying a slurry including aluminum nitride particles to a combustion flame; and spraying the slurry including the aluminum nitride particles onto a base material (substrate) with a spraying speed adjusted to 400 to 1000 m/sec.

It is preferable that an average particle diameter of the aluminum nitride particles be 0.05 to 5 μm. It is also preferable that a thickness of the aluminum nitride coating be no less than 10 μm. Further, it is also preferable that the slurry containing the aluminum nitride particles is supplied to a center of the combustion flame.

When such aluminum nitride coating is provided to a component for a plasma apparatus used in a plasma discharge operation, the component enables enhancement in plasma resistance of the component, enables significant suppression in amount of particles generated and impurity contamination amount. The component also prevents damage such as corrosion and/or deformation of members due to chemical treatment and/or blasting in reuse processing, enabling significant reduction in number of times of apparatus cleaning and component replacements.

Reduction in amount of particles to be generated greatly contributes to improvement in production yield of various thin films for which plasma processing is performed and elements and components using such thin films.

Also, reduction in number of times of apparatus cleaning and/or component replacement greatly contributes to improve the productivity as well as reduction in etching cost and film-forming cost.

The present invention enables provision of a component for a plasma apparatus, the component enabling stable and effective suppression of generation of fine particles from the component and suppression of productivity decrease and component cost increase due to, e.g., frequent apparatus cleaning and/or component replacement. The component is able to be also employed for manufacture of a highly-integrated semiconductor element, so that there can be provided a component and a method of manufacturing the component enabling, e.g., reduction of etching and/or film-forming costs by improvement in operating rate of the plasma apparatus.

DESCRIPTION OF EMBODIMENT

An embodiment of the present invention will be described below.

In a component for a plasma apparatus according to the present invention, the component comprising: an aluminum nitride coating formed on a surface of a base material by impact sintering method, the aluminum nitride coating contains aluminum nitride particles, a thickness of the coating is no less than 10 μm, and a density of the coating is no less than 90%, an area ratio of aluminum nitride particles whose particle boundaries are recognizable existing in an unit area of 20 μm×20 μm in a coating structure is 0% to 90% while an area ratio of aluminum nitride particles whose particle boundaries are unrecognizable is 10% to 100%.

Figure 1:
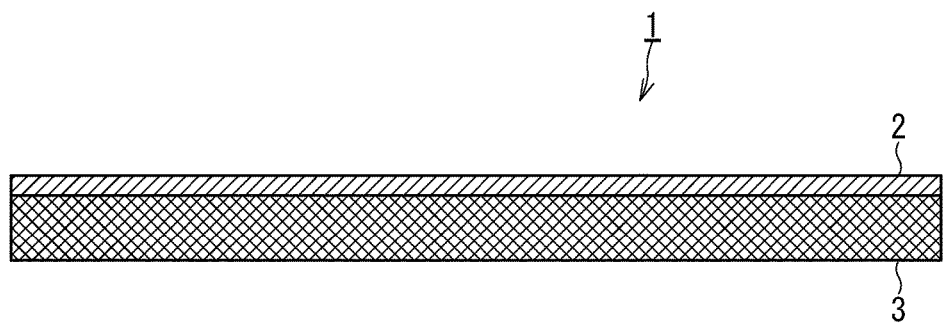
FIG. 1 is a cross-sectional view schematically illustrating a cross-sectional structure of a component for a plasma apparatus according to the present invention.

FIG. 1 illustrates an example of the component for a plasma apparatus according to the present invention. In the figure, reference numeral 1 denotes a component for a plasma apparatus, reference numeral 3 denotes a base material, and reference numeral 2 denotes an aluminum nitride coating integrally formed on a surface of the base material 3.

As a material for constituting the coating, aluminum nitride (AlN), which exhibits high resistance to plasma attack and radical (for example, active F radical or Cl radical) attack, in particular, chlorine-based plasma attack and fluorine-based plasma attack, is preferably used.

Figure 2:
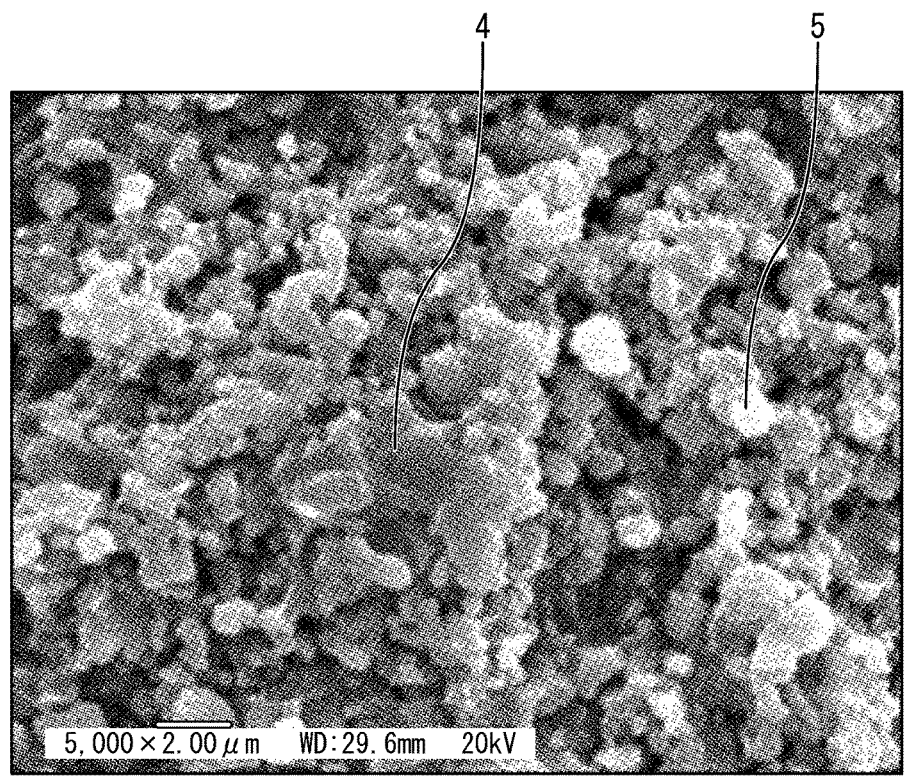
FIG. 2 is a microstructure diagram (photograph) illustrating an example of an aluminum nitride coating.

Aluminum nitride particles whose particle boundaries are recognizable can be recognized (visually confirmed) in an enlarged photograph of a coating structure. For example, an enlarged photograph is taken by a scanning-type electronic microscope with a magnification of 5000 times. FIG. 2 illustrates a structure diagram illustrating an example of an aluminum nitride coating (enlarged photograph). In the figure, reference numeral 4 denotes an aluminum nitride particle whose particle boundary is unrecognizable, and reference numeral 5 denotes an aluminum nitride particle whose particle boundary is recognizable.

In "aluminum nitride particles whose particle boundaries are recognizable", particle boundaries of individual particles can be recognized by contrast differences. On the other hand, in "aluminum nitride particles whose particle boundaries are unrecognizable", adjacent AlN particles are bonded together, which makes particle boundaries of the individual particles unrecognizable.

A unit area that is a field of view for observing a state of a structure of the coating is set to 20 μm×20 μm. Also, a measurement is performed for the unit area at each of three arbitrary fields of view, and the average values of the measurements are determined as area ratios of the "aluminum nitride particles whose particle boundaries are recognizable" and the "aluminum nitride particles whose particle boundaries are unrecognizable". FIG. 2 indicates a state in which particle groups of "aluminum nitride particles whose particle boundaries are recognizable" and particle groups of "aluminum nitride particles whose particle boundaries are unrecognizable" are coexisting.

Impact sintering is a coating method of forming a film by spraying particles via a combustion flame, in which particles collide with a base material at a high speed and heat generated by crushing of the particles due to the collision causes the particles to be sintered and bonded, and a coating is thereby formed.

Therefore, there is a tendency that a coating of aluminum nitride particles in a crushed form is more easily formed compared to that of particles in a particle form in raw powder.

Further, as a result of controlling the spraying speed of aluminum nitride particles to be high and equal to or exceeding a critical speed at which particle deposition starts, a film can be formed without melting and decomposing aluminum nitride particles, so that there can be provided an aluminum nitride coating which has a high film density and a particle form in which a form of the raw powder is substantially maintained.

Since a high-speed spraying is possible in the impact sintering method, a structure in which "aluminum nitride particles whose particle boundaries are recognizable" and "aluminum nitride particles whose particle boundaries are unrecognizable" are coexisting can easily be obtained.

When assuming that a total of the area ratios of the "aluminum nitride particles whose particle boundaries are recognizable" and the "aluminum nitride particles whose particle boundaries are unrecognizable" is 100%, it is important that: the area ratio of the "aluminum nitride particles whose particle boundaries are recognizable" is 0% to 90%; and the area ratio of the "aluminum nitride particles whose particle boundaries are unrecognizable" is 10% to 100%.

The afore-mentioned impact sintering is a film-forming method in which aluminum nitride particles are sprayed at a high speed and particles are deposited by heat generated by breakage of the particles when the particles collide with the base material. At the time of the deposition of particles by the heat of breakage, aluminum nitride particles are bonded together by the heat of breakage and aluminum nitride particles whose particle boundaries are unrecognizable are thereby formed.

Further, when the high-speed spraying is used, the raw material powder is not melted for spraying as opposed to thermal spraying, which enables deposition of aluminum nitride particles with the powder form of the aluminum nitride particles in the raw powder being maintained. Thus, no stress is generated inside the film, thus enabling formation of a dense and strongly-bonded film.

If the area ratio of the "aluminum nitride particles whose particle boundaries are recognizable" exceeds 90%, the heat of breakage caused by an impact is insufficient and the particles are sharply (rapidly) cooled down at the time of deposition, the MN coating causes decrease in density and bonding strength of the coating film, and in some cases, causes cracking. The area ratio of the "aluminum nitride particles whose particle boundaries are recognizable" is preferably 0% to 50%. This means that the area ratio of the "aluminum nitride particles whose particle boundaries are unrecognizable" is preferably in a range of 50% to 100%.

Also, it is necessary that a film thickness of the aluminum nitride coating should be no less than 10 μm. If the film thickness is less than 10 μm, no sufficient effect of provision of the aluminum nitride coating can be obtained, and contrarily, a peeling of the film may occur.

An upper limit of the thickness of the aluminum nitride coating is not specifically determined; however, an excessively large thickness provides no further effect and causes cost increase. Therefore, the thickness of the aluminum nitride coating should be specified in a range of 10 to 200 μm, more preferably in a range of 50 to 150 μm.

Further, it is necessary that a density of the coating be no less than 90%. A coating density (film density) is a counter term of a porosity, and a coating density of no less than 90% means a porosity of no more than 10%.

In a method for coating density measurement, an enlarged photograph of a cross-sectional structure of an aluminum nitride coating in a film thickness direction is taken by an optical microscope with a magnification of 500 times, and an area ratio of pores in the photograph is calculated. More specifically, the coating density is calculated according to the following expression:

"film density (%)=100−area ratio of pores"

For calculation of the coating density, the area of the coating structure in a unit area of 200 μm×200 μm is analyzed. If the film thickness is small, measurement is performed for a plurality of field of view so that a total of unit areas of the sites amounts to 200 μm×200 μm.

The density of the coating is no less than 90%, preferably no less than 95%, more preferably no less than 99% and no more than 100%. If many pores (voids) are included in the aluminum nitride coating, erosion caused by plasma attack progresses through the pores, resulting in decrease in lifetime of the aluminum nitride coating. In particular, it is important that the number of pores existing in a surface of the aluminum nitride coating is small.

Also, it is preferable that a surface roughness Ra of the aluminum nitride coating should be made to be no more than 0.5 μm by performing a polishing to the coating. If the surface roughness Ra after the polishing is no more than 0.5 μm, the wafer is in close contact with the dielectric layer, which improves the uniformity of etching.

On the other hand, if the surface roughness Ra after polishing exceeds 0.5 μm, the wafer deforms and thus the close-contacting property is decreased, causing drawbacks that are non-uniformity of etching and easy generation of particles.

Further, it is also preferable that: an average particle diameter of aluminum nitride particles whose particle boundaries are recognizable is no more than 2 μm; and an average particle diameter of all the aluminum nitride particles including aluminum nitride particles whose particle boundaries are unrecognizable is no more than 5 μm.

As described later on, an average particle diameter of aluminum nitride powder as raw material powder used in impact sintering method is preferably in a range of 0.05 to 5 μm. If the average particle diameter of aluminum nitride particles in raw powder exceeds 5 μm, when the particles collide with the base material, the particles scatter without being crushed and a coating is thus difficult to form, and furthermore, a blast action of the particles themselves may damage the coating, which may cause cracking of the coating.

Furthermore, if the average particle diameter of the aluminum nitride particles is no more than 5 μm, when fine particles collide with the base material, crushing of the particles moderately progress and heat generated by the crushing progresses the particles bonding and a coating is thus easy to form. The formed coating has a large strength of bonding among the particles, so that the coating is less damaged by plasma attack and radical attack, and the coating generates a smaller amount of particles and has improved plasma resistance.

A more preferable value of the particle diameter of the aluminum nitride particles is no less than 0.05 μm and no more than 3 μm. If the particle diameter is less than 0.05 μm, progress of particle crushing becomes difficult. In this case, although a coating is formed, however, the coating has a low density and exhibits decreased plasma resistance and corrosion resistance. Therefore, it is preferable that an available range of the particle diameter of the fine particles is 0.05 to 5 μm.

However, as long as a percentage of fine particles having a particle diameter of less than 0.05 μm in all the aluminum nitride particles is less than 5%, powder containing the fine particles of less than 0.05 μm can be used because degradation in formation of coating does not occur.

In a method for calculation of an average particle diameter of aluminum nitride particles, the calculation is performed using an enlarged photograph such as one in FIG. 2. For aluminum nitride particles whose particle boundaries are recognizable, a longest diagonal line in each particle in the photograph is measured as a particle diameter of the particle. For aluminum nitride particles whose particle boundaries are unrecognizable, a diameter of a virtual circle of each particle is measured as a particle diameter of the particle. The above measurement is performed for 50 particles for each of the aforementioned two particle types, that is, a total of 100 particles, and an average value of the particle diameters of the particles is determined as the average particle diameter.

Further, in the aluminum nitride coating, it is preferable that where the coating is subjected to XRD analysis, a ratio (Im/Ic) of a most intensive peak Im of AlN to a most intensive peak Ic of $Al_2O_3$ is no less than 8.

Next, a method of manufacturing a component for a plasma apparatus according to the present invention will be described.

A method of manufacturing a component for a plasma apparatus according to the present invention, the component including an aluminum nitride coating formed on a surface of a base material by impact sintering, the method comprises the steps of: supplying a slurry including aluminum nitride particles to a combustion flame; and spraying the aluminum nitride particles onto the base material with a spraying speed adjusted to 400 to 1000 m/sec.

It is preferable that an average particle diameter of the aluminum nitride particles is 0.05 to 5 μm. It is also preferable that a film thickness of the aluminum nitride coating is no less than 10 μm. It is also preferable that the slurry including the aluminum nitride particles is supplied to a center of the combustion flame.

Impact sintering is a film-forming method in which slurry including aluminum nitride particles is supplied into a combustion flame thereby to spray the aluminum nitride particles at a high speed.

A film-forming apparatus in which impact sintering is performed comprises: a combustion source material supply port for supplying a combustion source material; and a combustion chamber connected to the combustion source material supply port. In the combustion chamber, the combustion source material is burned, whereby a combustion flame is generated at a combustion flame port. In the vicinity of the combustion flame, a slurry supply port is provided, and an aluminum nitride particle slurry supplied from the slurry supply port is sprayed onto a base material from the combustion flame via a nozzle, thereby to form a coating film. As the combustion source material, e.g., oxygen, acetylene or kerosene is used, and two or more types of combustion source materials may be used as necessary.

Furthermore, a temperature of the combustion flame is controlled by adjustment of combustion conditions, such as a combination ratio (mixing ratio) of the combustion source materials and a charging amount of cooling gas, so as to be less than a boiling point of the aluminum nitride particles for forming a film.

If the temperature of the combustion flame is higher than the boiling point, even if a high-speed spraying is performed, the aluminum nitride particles supplied in the form of the slurry are evaporated, decomposed or melted, and as a result, there may be a case where no coating is deposited or even if a coating is deposited, a form of the coating becomes similar to that of a coating formed by thermal spraying.

In a case where an aluminum nitride coating is formed by impact sintering, it is preferable that a speed of spraying of aluminum nitride particles is specified in a range of no less than 400 m/sec and no more than 1000 m/sec. If the spraying speed is low to be less than 400 m/sec, the crushing of particles when the particles collide with the base material is insufficient, which may result in failure to obtain a film having a high film density.

Further, if the spraying speed exceeds 1000 m/sec, a force of the collision becomes excessively large, whereby a blast effect provided by the aluminum nitride particles is easily caused, and thus resulting in failure to obtain an intended film.

In a case where an aluminum nitride particle slurry is charged into the slurry supply port, it is preferable that the slurry is supplied so as to be positioned at the center of the combustion flame. If the aluminum nitride particle slurry is supplied to the outer side of a combustion flame, the spraying speed becomes unstable.

Furthermore, some of the aluminum nitride particles are sprayed to the outer side of the combustion flame, and some of the aluminum nitride particles are sprayed after reaching the center. Even in a same combustion flame, temperatures of the outer side and the inner side of the combustion flame are slightly different. Forming a film at a uniform temperature and a same spraying speed to the extent possible enables to control a structure of "particles whose particle boundaries are recognizable" and "particles whose particle boundaries are unrecognizable".

The impact sintering is a film-forming method of forming a film by spraying particles using a combustion flame, in which the particles collide with a base material at a high speed, the particles are sintered and bonded by crushing heat of the particles due to the collision and a coating is thereby formed.

Therefore, during the coating formation, there is a tendency that a coating of aluminum nitride particles in a crushed form is easily formed compared to that of particles in a particle form in the raw powder.

Further, when the speed of spraying the aluminum nitride particles is controlled to be high and equal to or exceeding a critical speed at which particle deposition starts, the film can be formed without melting and decomposing aluminum nitride particles, so that there can be provided an aluminum nitride coating having a high film density.

Furthermore, according to the impact sintering method, high-speed spraying is possible, and thus, "particles whose particle boundaries are unrecognizable" can easily be obtained. Thus, there can efficiently be obtained an aluminum nitride coating of the present invention in which an area ratio of aluminum nitride particles whose particle boundaries are recognizable is 0% to 90% while an area ratio of aluminum nitride particles whose particle boundaries are unrecognizable is 10% to 100%.

Further, in order to control the "particles whose particle boundaries are recognizable" and the "particles whose particle boundaries are unrecognizable", it is also effective to adjust a spraying distance L ranging from the nozzle to the base material. As described hereinbefore, the impact sintering is a method in which aluminum nitride particles are sprayed at a high speed using a combustion flame and are sintered and bonded using heat generated by crushing of the particles due to collision, and thereby to deposit the crushed particles onto a surface of the base material.

In order to form a film of aluminum nitride particles once heated by a combustion flame without the aluminum nitride particles turning into a melted flat form, it is preferable that the spraying distance L is adjusted to 100 to 400 mm.

If the spraying distance L is less than 100 mm, the distance is so small that the aluminum nitride particles cannot be crushed, resulting in difficulty in obtaining a sinter-bonded coating.

On the other hand, if the spraying distance L exceeds 400 mm, the distance is so large that a force of impact is small, resulting in difficulty in obtaining an intended aluminum nitride coating. Controlling the aforementioned spraying speed and/or the sizes of the aluminum nitride particles in raw powder enables to control the structure as to whether the structure is melted or un-melted. Preferably, the spraying distance L is 100 to 200 mm.

As the nitride particle slurry, it is preferable to prepare a slurry containing nitride particles having an average particle diameter of 0.05 to 5 μm as the form of raw powder. As a solvent for slurrying, it is preferable to use a relatively-volatile solvent such as methyl alcohol or ethyl alcohol or the like.

Further, it is also preferable that the nitride particles are sufficiently crashed so as to include no coarse particles and then mixed into the solvent. For example, if such coarse particles having a particle diameter of no less than 20 μm exist, it is difficult to obtain a uniform coating.

Furthermore, it is also preferable that a ratio of the nitride particles in the slurry is set to 30 to 80 vol %. A slurry having a suitable fluidity is more smoothly supplied into the supply port and a supply amount of the slurry thus becomes stable, so that there can be obtained a uniform coating.

When the impact sintering method such as described above is employed, there can be formed an aluminum nitride coating having high plasma resistance while maintaining a crystal structure of raw material powder (aluminum nitride particles).

According to the above-described configuration, the plasma resistance of a component for a plasma apparatus is significantly improved, thus enabling particle reduction and impurity contamination reduction and also increase in lifetime of the component. Therefore, if an apparatus uses such component for a plasma etching apparatus, the particle generation caused during plasma process can be reduced and number of times of component replacement can be also reduced.

Further, by means of the impact sintering method, slurry particles are sprayed onto a base material and the particles are deposited by energy of collision of the particles onto the base material, so that the need for blasting when a coating is deposited on the component can be eliminated, and thus no abrasive remains and no surface defects are generated. As a result, a coating adhesion is significantly improved. It can be considered that this is because: an oxide coating having formed on a surface of the component is broken by high-speed collision of particles and an active surface is exposed, which allows a coating to be directly formed on the surface of the component; and heat generated by breakage of particles due to subsequent particle collision causes bonding among the particles and a coating is thereby formed.

Therefore, the generation of particles due to separation of aluminum nitride coating deposited on the component can effectively be suppressed, and the number of times of apparatus cleaning and component replacement can be significantly reduced.

Reduction in amount of the generated particles greatly contributes to improvement in production yield of various thin films that are subjected to etching or are formed in semiconductor manufacturing apparatuses and elements and components using such thin films.

Further, reduction in number of times of apparatus cleaning and component replacement and increase in lifetime of the component by eliminating the need for blasting greatly contribute to productivity improvement and etching cost reduction.

EXAMPLES

Examples 1 to 7 and Comparative Example 1

Using a combustion flame-type spraying apparatus, each aluminum nitride coating was formed on a base material (300 mm×3 mm) composed of alumina ($Al_2O_3$) through an impact sintering method under the conditions indicated in Table 1 thereby to prepare an electrostatic chuck as a component for a plasma apparatus. As a solvent for preparing each slurry in which aluminum nitride (AlN) particles as raw material powder are dispersed in the solvent, ethyl alcohol was used for the respective Examples. The aluminum nitride particles have the average particle diameter indicated in Table 1. Further, as the raw material powder used in each of the Examples, aluminum nitride particles having a high purity of no less than 99.9% were used. For the aluminum nitride particles as the raw material powder, there was used raw material powder in which coarse particles having a particle diameter exceeding 10 μm were eliminated by sufficient crushing and sieving.

Comparative Example 1 is a component comprising a coating (film) formed of an aluminum nitride sintered body to which a sintering aid is added.

TABLE 1

| Sample No. | Material Powder AlN Average Particle Diameter (μm) | AlN Slurry Ratio of AlN Particles (vol %) | Supply to Center of Combustion Flame | Spraying Speed (m/sec) | Spraying Distance L (mm) | Thickness of AlN Film (μm) |
|---|---|---|---|---|---|---|
| Example 1 | AlN (2.1) | 40 | Yes | 520 | 140 | 100 |
| Example 2 | AlN (2.7) | 60 | Yes | 610 | 100 | 120 |
| Example 3 | AlN (2.3) | 50 | Yes | 750 | 150 | 80 |
| Example 4 | AlN (4.2) | 40 | Yes | 430 | 130 | 30 |
| Example 5 | AlN (3.9) | 30 | Yes | 550 | 180 | 150 |
| Example 6 | AlN (3.3) | 50 | Yes | 450 | 200 | 190 |
| Example 7 | AlN (1.7) | 40 | No | 560 | 130 | 60 |
| Comparative Example 1 | AlN (4) | Film Formation by Sintering Method | | | | 500 |

Next, with respect to each of the aluminum nitride coatings of the components formed in the respective Examples and the Comparative Example, a film density, area ratios of particles whose particle boundaries are recognizable and particles whose particle boundaries are unrecognizable, and an average particle diameter and a crystal structure of the particles whose particle boundaries are recognizable in the aluminum nitride coating were analyzed. Comparative Example 1 is a comparative component comprising a coating film formed of a sintered body obtained by sintering method in which 0.5% of a sintering aid of $Y_2O_3$ is added.

The film density was obtained by taking an enlarged photograph (magnification of 500 times) of cross-sections of the film so that a total of unit areas of the cross-sections amounts to 200 μm×200 μm and calculating a ratio of pores in the photograph.

The area ratios of particles whose particle boundaries are recognizable and particles whose particle boundaries are unrecognizable were obtained by taking an enlarged photograph (magnification of 5000 times) of a unit area of 20 μm×20 μm in a surface of the coating film and obtaining an area ratio of aluminum nitride particles whose respective particle boundaries can be distinguished, as "particles whose particle boundaries are recognizable" and an area ratio of aluminum nitride particles whose respective particle boundaries cannot be distinguished because of mutual bonding of the particle boundaries, as "particles whose particle boundaries are unrecognizable".

This work was performed for each of three arbitrary fields of view (unit areas), and average values of measured values in the three fields of view were determined as area ratios (%) of "particles whose particle boundaries are recognizable" and "particles whose particle boundaries are unrecognizable". In addition, the average particle diameter of the "particle whose particle boundaries are recognizable" was measured using the same enlarged photograph.

Furthermore, the crystal structure of each coating film was examined by means of XRD analysis. In the XRD analysis, a Cu target was used, and measurement was performed under the conditions that are a tube voltage of 40 kV and a tube current of 40 mA so as to figure out a ratio (Im/Ic) of a most intensive peak Im of AlN to a most intensive peak Ic of $Al_2O_3$. Results of the measurement are indicated in Table 2 below.

TABLE 2

| Sample No. | Film Density (%) | Area Ratios of Particles whose Particle Boundaries are recognizable (%) | Area Ratios of Particles whose Particle Boundaries are unrecognizable (%) | Particles whose Particle Boundary is Recognizable Average Particle Diameter (μm) | Crystal Structure Im/Ic |
|---|---|---|---|---|---|
| Example 1 | 98.2 | 33 | 67 | 2 | 8.9 |
| Example 2 | 98.7 | 45 | 55 | 2.3 | 8.5 |
| Example 3 | 99.1 | 30 | 70 | 2.4 | 8.7 |
| Example 4 | 98.5 | 53 | 47 | 2.1 | 8.1 |
| Example 5 | 99.4 | 10 | 90 | 3.4 | 9.2 |
| Example 6 | 97.8 | 65 | 35 | 3.5 | 8.6 |
| Example 7 | 95.8 | 78 | 22 | 4.7 | 8.1 |
| Comparative Example 1 | 97.8 | 100 | 0 | 24.8 | 0 |

As is clear from the results indicated in Table 2 above, the aluminum nitride coating (film) of the component according to each of the examples had a high film density and a ratio (area ratio) of "aluminum nitride particles whose particle boundaries are recognizable" was in a range of 0% to 90%.

Further, as the result of using the impact sintering method, the aluminum nitride particles had a size that is relatively smaller than that of the raw material powder. Furthermore, since the particles were not over-melted, the crystal structure was the same as that of the raw material powder.

A surface roughness Ra of each of the aluminum nitride coatings of the components according to Examples 1 to 7 was no more than 0.5 μm. A surface roughness Ra of the aluminum nitride coating in Comparative Example 1 was 1.5 μm.

Next, each of the electrostatic chucks according to the Examples and the Comparative Example was placed in a plasma etching apparatus, and exposed to an etching gas mixture of $CF_4$ (50 sccm), $O_2$ (20 sccm) and Ar (50 sccm). The plasma etching apparatus was continuously operated for two hours under the conditions that a vacuum degree of inside the etching chamber was set to 10 mTorr and an output was set to 300 W (with a bias of 100 W).

Thereafter, with respect to the resultant aluminum nitride coating, an area ratio of dropped-out and adhered particles was measured as pealing evaluation, using a tape peeling method. More specifically, a conductive carbon tape was attached to the aluminum nitride coating film, thereafter, the tape was peeled off. Then, the peeled tape was observed by means of an SEM thereby to measure the area ratio of the aluminum nitride particles existing in a view field of 125 μm×95 μm.

In addition, variation between weights of the component before and after the test of exposure to the etching gas mixture was measured thereby to obtain a weight decrease per unit area. Results of the measurement are indicated in Table 3 below.

TABLE 3

| Sample No. | Weight Decrease (mg/cm$^2$) | Peeling Evaluation (Area of Peeled AlN Particles per Unit Area of 125 μm × 95 μm) |
| --- | --- | --- |
| Example 1 | 0.235 | 0.412 |
| Example 2 | 0.247 | 0.398 |
| Example 3 | 0.266 | 0.426 |
| Example 4 | 0.271 | 0.388 |
| Example 5 | 0.213 | 0.451 |
| Example 6 | 0.227 | 0.432 |
| Example 7 | 0.249 | 0.474 |
| Comparative Example 1 | 0.965 | 7.659 |

Further, as a result of measurement of a volume resistivity of each aluminum nitride coating film at room temperature (25° C.) by means of four-terminal sensing (compliant with JIS K 7194), the value of volume resistivity were 2.7 to $3.3 \times 10^{11}$ Ω·cm.

As is clear from the results indicated in table 3 hereinabove, it had been confirmed that the component for a plasma apparatus according to each of the Examples exhibited high resistance to plasma attack and radical attack. Exhibiting high resistance to plasma attack and radical attack means that when the component according to each of the Examples is used in a dry-etching apparatus, the generation of particles can be effectively suppressed.

Although the above Examples were exemplarily explained by referring to cases where the base material was formed of alumina ceramics, it has been also confirmed by a test that effects that are equivalent to those of the Examples can also be obtained in other cases where a base material composed of a metal is used.

As described above, according to a component for a plasma apparatus according to the present invention, generation of particles from the component can stably and effectively prevented. Further, the corrosion of the coating film caused by an active radical of a corrosive gas can be remarkably suppressed, so that the generation of particles from the coating film can be prevented, thus enabling reduction in corrosion product and suppression of generation of particles due to coating dropout. Therefore, the number of times of cleaning and component replacement of the component for a plasma apparatus can be effectively reduced.

REFERENCE SIGNS LIST

1 . . . component for plasma apparatus
2 . . . aluminum nitride coating (film)
3 . . . base material
4 . . . aluminum nitride particles whose particle boundary is unrecognizable
5 . . . aluminum nitride particles whose particle boundary is recognizable

What is claimed is:

1. A component for a plasma apparatus, the component comprising: a base material composed of a metal or ceramics; and an aluminum nitride coating formed on a surface of the base material, wherein a thickness of the aluminum nitride coating is no less than 10 μm, a film density of the aluminum nitride coating is no less than 90%, and an area ratio of aluminum nitride particles whose particle boundaries are recognizable existing in a unit area of 20μm×20 μm in the aluminum nitride coating is 0% to 90% while an area ratio of aluminum nitride particles whose particle boundaries are unrecognizable is 10% to 100%, wherein when the aluminum nitride coating is subjected to XRD analysis a ratio (lm/lc) of a most intensive peak lm of AlN to a most intensive peak lc of $Al_2O_3$ is no less than 8.

2. The component for a plasma apparatus according to claim 1, wherein the base material is composed of ceramics with a metal electrode embedded inside the ceramics, and the aluminum nitride coating is provided on the surface of the base material.

3. The component for a plasma apparatus according to claim 1, wherein the aluminum nitride coating is an aluminum nitride coating formed by impact sintering.

4. The component for a plasma apparatus according to claim 1, wherein an average particle diameter of all particles included in the aluminum nitride coating is no more than 5 μm.

5. The component for a plasma apparatus according to claim 1, wherein the particles constituting the aluminum nitride coating include fine particles each having a particle diameter of no more than 1 μm.

6. The component for a plasma apparatus according to claim 1, wherein the film thickness of the aluminum nitride coating is 10 to 200 μm and the film density of the aluminum nitride coating is no less than 99% and no more than 100%.

7. The component for a plasma apparatus according to claim 1, wherein an average particle diameter of the aluminum nitride particles whose particle boundaries are recognizable is no more than 2 μm.

8. The component for a plasma apparatus according to claim 1, wherein an average particle diameter of the aluminum nitride particles is 0.05to 5 μm.

9. The component for a plasma apparatus according to claim 1, wherein the aluminum nitride coating is formed via polishing so as to have a surface roughness Ra of no more than 0.5 μm.

10. A method of manufacturing a component for a plasma apparatus according to claim 1, the component comprising: a base material composed of a metal or ceramics; and an aluminum nitride coating formed on a surface of the base material, the aluminum nitride coating is formed by impact sintering, the method comprising the steps of: supplying a slurry containing aluminum nitride particles to a combustion flame; and spraying the aluminum nitride particles onto the base material so as to achieve a spraying speed of 400 to 1000 m/sec.

11. The method of manufacturing a component for a plasma apparatus according to claim 10, wherein the aluminum nitride particles contained in the slurry are aluminum nitride particles having a purity of no less than 99.9%.

12. The method of manufacturing a component for a plasma apparatus according to claim 10, wherein an average particle diameter of the aluminum nitride particle is 0.05 to 5 μm.

13. The method of manufacturing a component for a plasma apparatus according to claim 10, wherein a film thickness of the aluminum nitride coating is no less than 10 μm.

14. The method of manufacturing a component for a plasma apparatus according to claim 10, wherein the slurry containing the aluminum nitride particles is supplied to a center of the combustion flame.

15. The method of manufacturing a component for a plasma apparatus according to claim 10, wherein a temperature of the combustion flame to which the slurry containing the aluminum nitride particles is supplied is adjusted to be less than a boiling point of the supplied aluminum nitride particles.

* * * * *